United States Patent [19]
Martich

[11] Patent Number: 6,052,045
[45] Date of Patent: Apr. 18, 2000

[54] ELECTROMECHANICAL SWITCHING DEVICE PACKAGE WITH CONTROLLED IMPEDANCE ENVIRONMENT

[75] Inventor: Mark E. Martich, Barrington, R.I.

[73] Assignee: Kearney-National, Inc., White Plains, N.Y.

[21] Appl. No.: 09/266,978

[22] Filed: Mar. 12, 1999

[51] Int. Cl.$^7$ ............................ H01H 51/00; H01H 1/66
[52] U.S. Cl. ............................................................ 335/151
[58] Field of Search .................................... 335/151–154, 335/208; 361/767, 768, 818, 819; 174/260–264; 333/12, 246

[56] References Cited

U.S. PATENT DOCUMENTS

| | | | |
|---|---|---|---|
| 3,575,678 | 4/1971 | Barton | 335/151 |
| 3,939,381 | 2/1976 | Meany | 361/765 |
| 4,947,235 | 8/1990 | Roth et al. | |
| 4,975,761 | 12/1990 | Chu | |
| 5,043,534 | 8/1991 | Mahulikar et al. | 174/52.4 |
| 5,175,613 | 12/1992 | Barker, III et al. | 257/713 |
| 5,239,198 | 8/1993 | Lin et al. | 257/693 |
| 5,294,826 | 3/1994 | Marcantonio et al. | 257/659 |
| 5,355,016 | 10/1994 | Swirbel et al. | 257/659 |
| 5,400,949 | 3/1995 | Hirvonen et al. | |
| 5,403,782 | 4/1995 | Dixon et al. | 437/209 |
| 5,422,433 | 6/1995 | Rivera et al. | 174/35 |
| 5,436,203 | 7/1995 | Lin | 437/209 |
| 5,459,287 | 10/1995 | Swamy | 174/266 |
| 5,483,423 | 1/1996 | Lewis et al. | 361/816 |
| 5,485,037 | 1/1996 | Marrs | 257/712 |
| 5,486,720 | 1/1996 | Kierse | 257/659 |
| 5,525,834 | 6/1996 | Fischer et al. | 257/691 |
| 5,530,202 | 6/1996 | Dais et al. | 174/35 |
| 5,535,101 | 7/1996 | Miles et al. | 367/808 |
| 5,541,450 | 7/1996 | Jones et al. | 257/697 |
| 5,543,663 | 8/1996 | Takubo | 257/720 |
| 5,557,142 | 9/1996 | Gilmore et al. | 257/659 |
| 5,559,306 | 9/1996 | Mahulikar | 174/52.4 |
| 5,561,265 | 10/1996 | Livshits et al. | 174/35 |
| 5,566,055 | 10/1996 | Salvi, Jr. | 361/816 |
| 5,574,314 | 11/1996 | Okada et al. | 257/728 |
| 5,583,378 | 12/1996 | Marrs et al. | 257/710 |
| 5,629,835 | 5/1997 | Mahulikar et al. | 361/719 |
| 5,633,786 | 5/1997 | Matuszewski et al. | 361/818 |
| 5,640,048 | 6/1997 | Selna | 257/738 |
| 5,650,659 | 7/1997 | Mostafazadeh et al. | 257/660 |
| 5,666,272 | 9/1997 | Moore et al. | 361/735 |
| 5,668,406 | 9/1997 | Egawa | 257/690 |
| 5,684,441 | 11/1997 | Graeber et al. | 335/4 |
| 5,694,300 | 12/1997 | Mattei et al. | 361/818 |
| 5,701,032 | 12/1997 | Fischer et al. | 257/692 |
| 5,708,567 | 1/1998 | Shim et al. | 361/723 |
| 5,777,382 | 7/1998 | Abbott et al. | 257/695 |
| 5,789,068 | 8/1998 | King et al. | 428/212 |
| 5,789,815 | 8/1998 | Tessier et al. | 257/723 |
| 5,796,170 | 8/1998 | Marcantonio | 257/786 |
| 5,798,567 | 8/1998 | Kelly et al. | 257/723 |
| 5,819,398 | 10/1998 | Wakefield | 29/830 |
| 5,831,832 | 11/1998 | Gillette et al. | 361/760 |
| 5,838,551 | 11/1998 | Chan | 361/818 |
| 5,854,512 | 12/1998 | Manteghi | 257/735 |

*Primary Examiner*—Michael L. Gellner
*Assistant Examiner*—Raymond Barrera
*Attorney, Agent, or Firm*—Barlow, Josephs & Holmes, Ltd.

[57] ABSTRACT

A reed switch package is disclosed that includes a reed switch with at least one electrical signal path. A cylindrical ground shield is provided about the reed switch. Ground terminals are connected to opposing sides of the ground shield so that the ground terminals are on opposing sides of the signal terminal and lie in the same plane. The reed switch resides on a support substrate. An electrically conductive signal via extends through said main body and connects to the signal terminal. Ground vias extend through the main body and respectively connect to the ground terminals. The grounds vias are on opposing sides of the signal via and lie in the same plane as the signal via. The signal and ground via exit at the bottom of the main body and are connected to a circuit via solder balls to provide a compact surface mount package with a controlled impedance environment.

13 Claims, 8 Drawing Sheets

ELECTROMECHANICAL SWITCHING DEVICE PACKAGE WITH CONTROLLED IMPEDANCE ENVIRONMENT

BACKGROUND OF THE INVENTION

The present invention relates generally to switching devices. More specifically, the present invention relates to improved packaging and circuit integration for electromagnetic devices, such as reed switches and electromagnetic devices such as reed relays.

Electromagnetic relays have been known in the electronics industry for many years. Such electromagnetic relays include the reed relay which incorporates a reed switch. A reed switch is a magnetically activated device that typically includes two flat contact tongues which are merged in a hermetically sealed glass tube filled with a protective inert gas or vacuum. The switch is operated by an externally generated magnetic field, either from a coil or a permanent magnet. When the external magnetic field is enabled, the overlapping contact tongue ends attract each other and ultimately come into contact to close the switch. When the magnetic field is removed, the contact tongues demagnetize and spring back to return to their rest positions, thus opening the switch.

Reed switches, actuated by a magnetic coil, are typically housed within a bobbin or spool-like member. A coil of wire is wrapped about the outside of the bobbin and connected to a source of electric current. The current flowing through the coil creates the desired magnetic field to actuate the reed switch within the bobbin housing. Some applications of reed devices require the switch to carry signals with frequencies in excess of 500 MHZ. For these applications, a ground shield conductor, commonly made of copper or brass is disposed about the body of the reed switch. The ground shield conductor is commonly in a cylindrical configuration. The shield conductor resides between the reed switch and the bobbin housing to form a co-axial high frequency transmission system. This co-axial system includes the outer shield conductor and the switch lead signal conductor co-axially through the center of the reed switch. The ground shield conductor is employed to contain the signal through the switch conductor in order to maintain the desired impedance of the signal path.

Currently available reed devices are then incorporated into a given circuit environment by users. For application at higher frequencies, a reed switch device must be ideally configured to match as closely as possible the desired impedance requirements of the circuit in which it is installed.

Within a circuit environment, a co-axial arrangement is preferred throughout the entire environment to maintain circuit integrity and the desired matched impedance. As stated above, the body of a reed switch includes the necessary coaxial environment. In addition, the signal trace on the user's circuit board commonly includes a "wave guide" where two ground leads reside on opposing sides of the signal lead and in the same plane or a "strip line" where a ground plane resides below the plane of the signal conductor. These techniques properly employed provide a two-dimensional co-axial-like environment which is acceptable for maintaining the desired impedance for proper circuit function.

However, the reed switch device must be physically packaged and electrically interconnected to a circuit board carrying a given circuit configuration. It is common to terminate the shield and signal terminals to a lead frame architecture and enclose the entire assembly in a dielectric material like plastic for manufacturing and packaging ease. These leads may be formed in a gull-wing or "J" shape for surface mount capability. The signal leads or terminals exit out of the reed switch body and into the air in order to make the electrical interconnection to the circuit board. This transition of the signal leads from plastic dielectric to air creates an undesirable discontinuity of the protective co-axial environment found within the body of the switch itself. Such discontinuity creates inaccuracy and uncertainty in the impedance of the reed switch device. As a result, circuit designers must compensate for this problem by specifically designing their circuits to accommodate and anticipate the inherent problems associated with the discontinuity of the protective co-axial environment and the degradation of the rated impedance of the reed switch device. For example, the circuit may be tuned to compensate for the discontinuity by adding parasitic inductance and capacitance. This method of discontinuity compensation is not preferred because it complicates and slows the design process and can degrade the integrity of the circuit. There is a demand to reduce the need to tune the circuit as described above. None of the prior art attempts address the problem of co-axial discontinuity and impedance matching integrity.

In view of the foregoing, there is a demand for a reed switch device that includes a controlled impedance environment through the entire body of the package to the interconnection to a circuit. There is further a demand for reed switch devices that are of a surface mount configuration to optimize the high frequency of the performance of the system. Further, there is a demand for a reed switch device that can reduce the need to tune a circuit to compensate for an uncontrolled impedance environment. Also, there is a demand for a reed switch device that has a small footprint and is of a standard shape and configuration for simplified installation.

SUMMARY OF THE INVENTION

The present invention preserves the advantages of prior art electromagnetic switch devices, such as reed relays. In addition, it provides new advantages not found in currently available switching devices and overcomes many disadvantages of such currently available devices.

The invention is generally directed to the novel and unique reed switch device with particular application in effectively interconnecting a reed switch device to a circuit on a circuit board. The reed switch package of the present invention enables the efficient and effective interconnection to a circuit board while being in an inexpensive construction.

A reed switch device is disclosed that includes a reed switch with at least one electrical signal path. A cylindrical ground shield is provided about the reed switch. Ground terminals are connected to opposing sides of the ground shield so that the ground terminals are on opposing sides of the signal terminal and lie in the same plane. The reed switch resides on a support substrate. An electrically conductive signal via extends through said main body and connects to the signal terminal. Ground vias extend through the main body and respectively connect to the ground terminals. The grounds vias are on opposing sides of the signal via and lie in the same plane as the signal via. The signal and ground via exit at the bottom of the main body and are connected to a circuit via solder balls to provide a compact surface mount package with a controlled impedance environment.

It is therefore an object of the present invention to provide a compact reed switch package.

It is an object of the present invention to provide a reed switch device with a controlled impedance environment throughout the entire package.

It is a further object of the present invention to provide a reed switch package that is easily matched to the impedance of an existing circuit environment.

Another object of the present invention is to provide a reed switch package that is capable of efficiently conducting high frequency signals.

It is a further object of the present invention to provide a reed switch package that is inexpensive to manufacture.

It is yet a further object of the present invention to provide a reed switch package with a small footprint.

Another object of the present invention is to provide a reed switch package that employs a standardize BGA configuration and body size.

BRIEF DESCRIPTION OF THE DRAWINGS

The novel features which are characteristic of the present invention are set forth in the appended claims. However, the invention's preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 1:
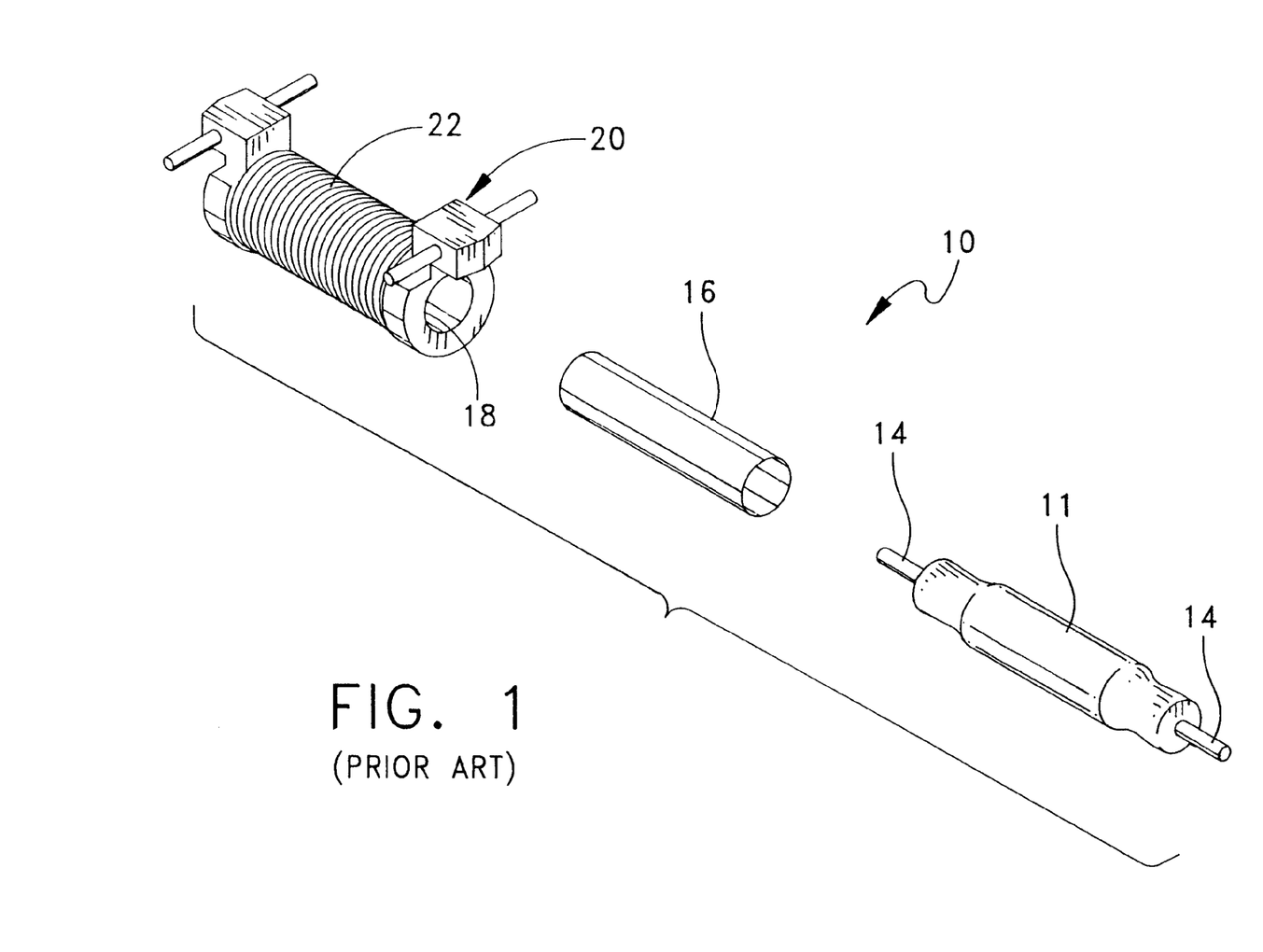
FIG. 1 is a perspective view of a prior art reed switch configuration.

Turning first to FIG. 1, a perspective view of a prior art reed switch configuration 10 is shown. A known reed switch 11 includes a glass envelope 12 as well as two signal leads 14 emanating from opposing ends of the reed switch 11. The construction of a reed switch 11 is so well known in the art, the details thereof need not be discussed. A shield conductor 16, commonly made of brass or copper, is provided in the form of a cylindrical sleeve which receives and houses the reed switch 11. The reed switch 11 and shield 16 are housed within the central bore 18 of a bobbin or spool 20. About the bobbin 20 is wound a conductive wire 22. As a result, a co-axial arrangement is formed to protect the reed switch 11 device and to controlled the impedance of the environment and to improve the overall transmission of the signal. The reed switch 11, shield conductor 16 and bobbin 20 are shown general as cylindrical in configuration. It should be understood that various other configurations, such as those oval in cross-section, may be employed and still be within the scope of the present invention.

As can be understood and known in the prior art, the free ends of the coil of wire 22, the shield 16 and signal terminals 14 of the reed switch 11 are electrically interconnected to a circuit as desired. The respective components of the reed switch 11 configuration are interconnected to a circuit by lead frame or other electrical interconnection (not shown). The lead frame or other electrical interconnection introduces a discontinuity of the desirable co-axial environment.

As described above, the overall reed switch device 10 must be designed to be easily accommodated within a user's circuit. For example, a circuit used to operate at high frequency is designed with a defined characteristic impedance environment. The goal of designing and manufacturing a reed device 10 to the specifications of a circuit customer is to as closely as possibly match the desired impedance of the device 10 to the circuit environment. It is preferred that there is no discontinuity of impedance from the reed device 10 itself to a circuit board trace of the circuit that will receive the device 10. The characteristic impedance $Z_1$ is, generally, a function of the outer diameter of the signal conductor 14, the inner diameter of the shield 16 and the dielectric constant of the insulation (not shown) between the signal conductor 14 and the shield 16.

Figure 4:
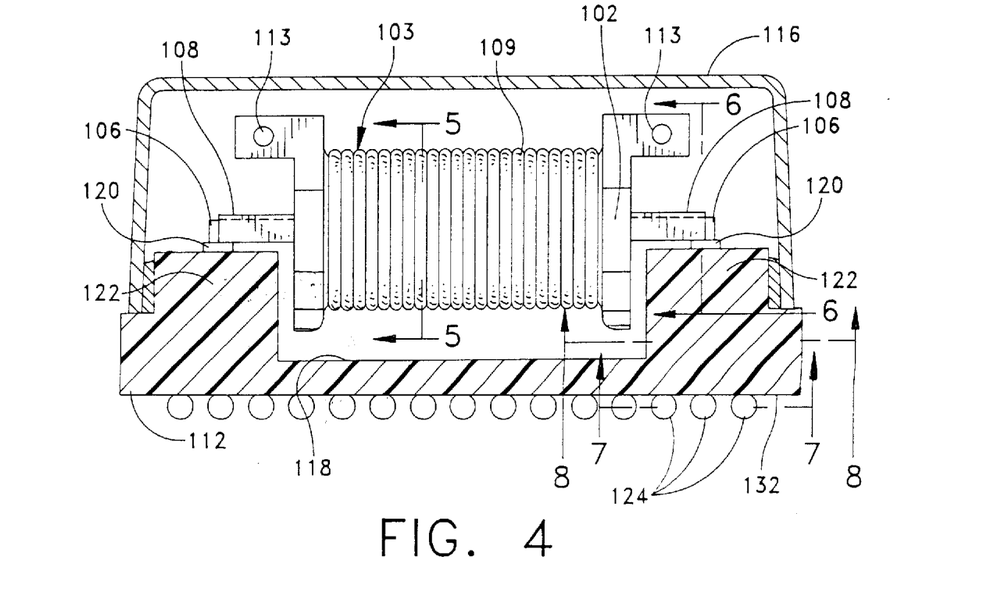
FIG. 4 is a cross-sectional view through the line 4—4 of FIG. 3 illustrating the mounting of the reed switch device within the housing in accordance with the present invention.
Figure 5:
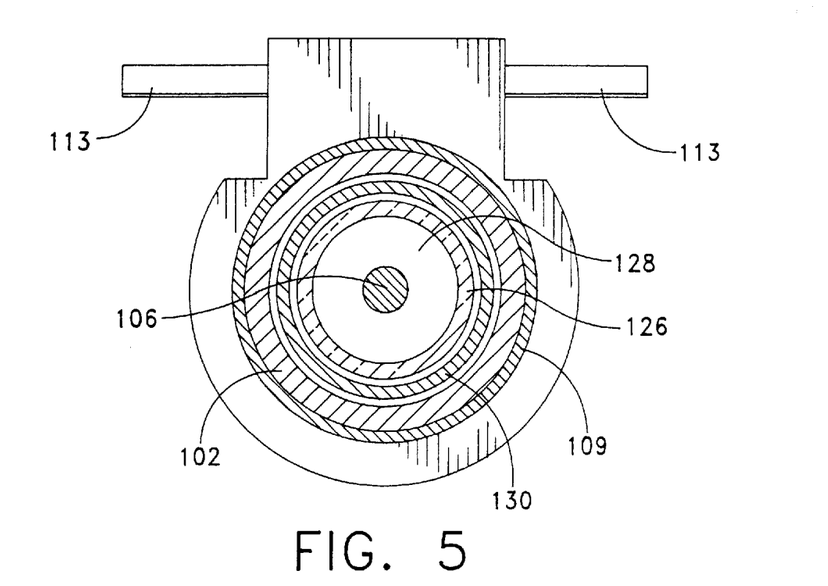
FIG. 5 is a cross-sectional view through the line 4—4 of FIG. 4.
Figure 6:
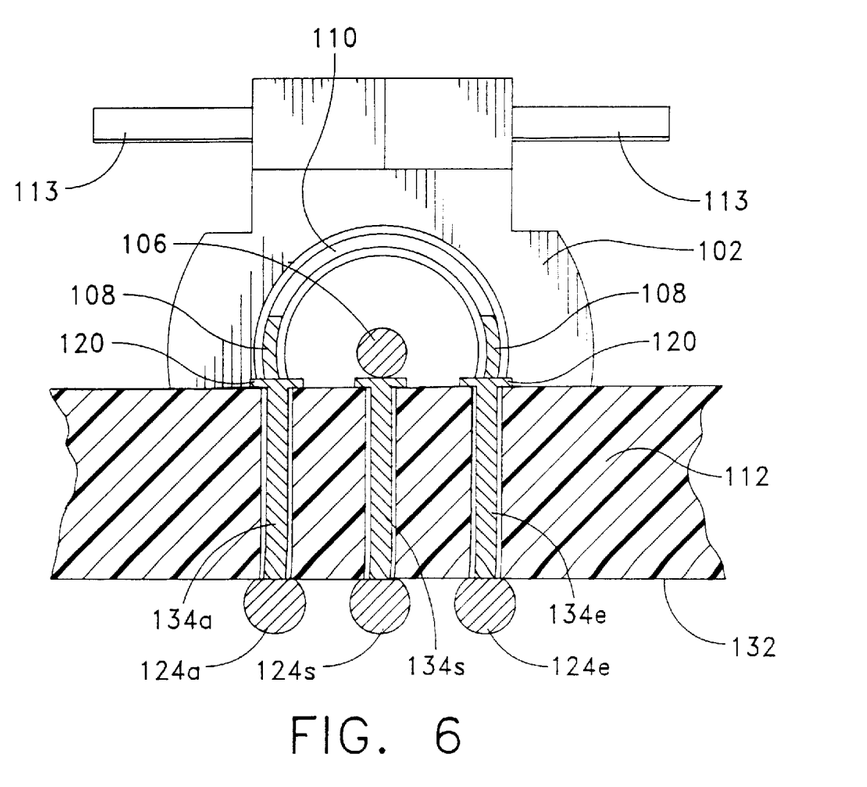
FIG. 6 is a cross-sectional view through the line 5—5 of FIG. 4.

Turning now to FIGS. 2–8, the preferred embodiment of the present invention is shown. Referring to FIG. 2A, a modified reed device 103 is provided to include an outer bobbin 102 with coil 109 wrapped therearound for introducing the necessary magnetic field to actuate the reed switch 111. Ends of wire 109 may be connected to posts 113 of bobbin 102. Emanating from the reed switch 111 are two signal leads 106 which correspond to opposing sides of the reed switch 111. Also emanating from the bobbin body 102 are a pair of shield or ground tabs 108 on each side of the bobbin body 102 that are electrically interconnected to, as shown in FIG. 6, the ends of the inner shield sleeve 110. As shown in FIG. 2B, these ground tabs 108 are extensions of from the shield sleeve 110 itself on opposing sides thereof.

Figure 3:
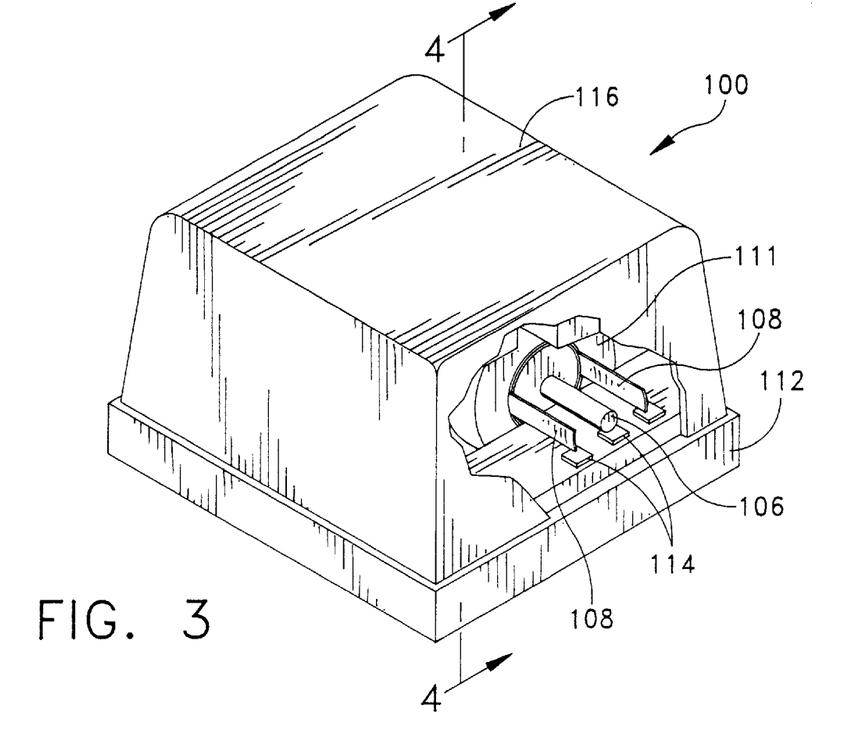
FIG. 3 is a perspective view of the reed switch package with a portion broken away for illustration purposes.

Referring to FIG. 3, a perspective view of the reed switch package 100 with housing is shown. This complete reed switch package 100 includes a substrate base 112 along with a number of contact pads 114 for receiving the signal lead 106 and ground leads 108 from the reed switch 111. A metal or non-metallic shell 116 is secured to the substrate base 112 with, for example, a bead of epoxy (not shown) around the perimeter to provide a liquid-tight seal. The entire assembly may be otherwise overmolded with plastic.

Turning now to FIG. 4, a cross-sectional view through the line 4—4 of FIG. 3 is shown. In particular, FIG. 4 illustrates in detail the positioning of the reed device 103 on the substrate base 112. The substrate base 112 includes a recessed central portion 118 for receiving the bobbin portion 102 of the reed device 103 to provide a short, straight signal path and reduce the overall size of the package 100. Contact pads 120 are provided at a seat portion 122 of the substrate base 112 to connect the signal leads 106 and ground leads 108. The reed device 103 is relatively light in weight so as to be supported entirely by the signal lead 106 and ground leads 108. However, other base substrate housings may be employed (not shown) where the bobbin 102 rests on its own seat or where additional contoured portions of the substrate 112 are provided to support the reed device 103.

As will be described in detail below, signal leads 106 and ground leads 108 are electrically interconnected to solder balls 124 for further electrical interconnection to a circuit on a circuit board (not shown). Along with the protective shell 116 (or solid encapsulant), a compact reed switch package 100 is provided that is of a surface mount configuration to accommodate high frequency reed switches 111 in a controlled impedance environment.

FIGS. 4 and 5 further illustrate the details of the construction of the reed switch 111 itself. In particular, the reed switch 111 includes a signal conductor 106 within a glass capsule 126 with an inert gas or vacuum 128 therebetween. Positioned about the glass capsule 126 is a ground shield 130 which is preferably of a cylindrical or tubular configuration but may be of an oval cross-section to accommodate certain reed switches 111 or multiple reed switches in a multiple channel environment. The foregoing assembly is housed within the bobbin 102 which includes an energizing coil 109 therearound. The free ends of the energizing coil 109 are connected to posts 113 which are electrically connected to corresponding solder balls 124 on the bottom surface 132 of the substrate base 112.

Figure 7:
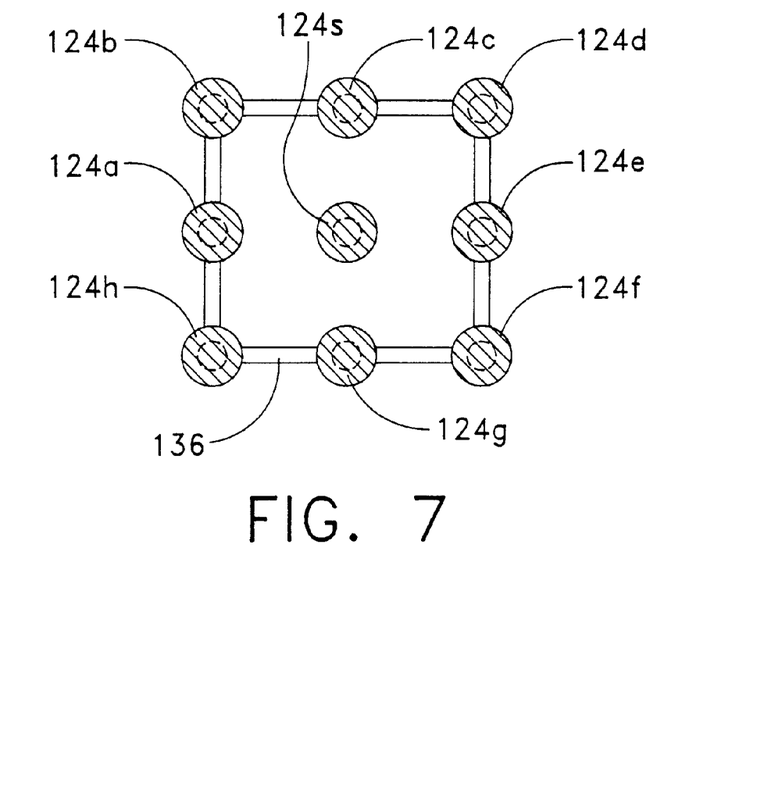
FIG. 7 is a cross-sectional view through the line 6—6 of FIG. 4.
Figure 8:
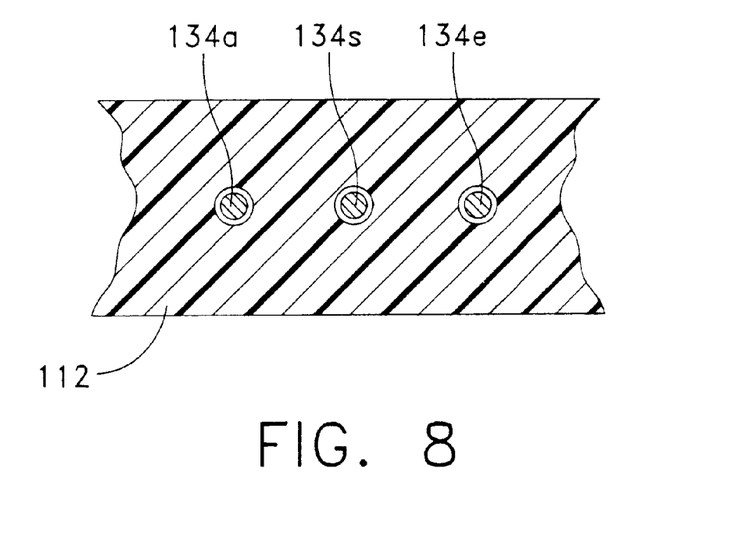
FIG. 8 is a cross-sectional view through the line 7—7 of FIG. 4.

In addition, as shown in FIGS. 6–8, the contact pads 120 are electrically interconnected to corresponding solder balls 124 on the bottom surface 132 of the substrate base 112. Referring to FIG. 6, a cross-section through the line 6—6 of FIG. 4, details of the important interconnection of the signal leads 106 and ground leads 108, via the contact pads 120 to the solder balls 124, is shown. In particular, FIG. 6 illustrates one side of the reed switch package 100. It should be understood that the construction and details of the opposing side of the reed switch package 100 is identical. For simplicity and ease of illustration only one side of the reed switch package 100 will be discussed.

The signal leads 106 and ground leads 108 are electrically interconnected to solder balls 124 on the bottom surface 132 of the substrate base 112 by electrically conductive vias through the plane of the substrate base 112. In this preferred embodiment, a conductive via is provided for the signal lead 106 and each of the ground leads 108. As shown in FIG. 8, a cross-section through the line 8—8 of FIG. 4, preferably three electrical conduits or vias, generally referred to as 134, are provided through the plane of the substrate base 112. A signal via 134s and ground vias 134a and 134e are provided. As stated above, the signal through the reed switch 111 is optimized when the co-axial configuration is maintained as much as possible through the entire body of the reed switch package 100. The through-plane wave guide of the present invention connects to solder balls 124 on the bottom surface 132 of the substrate base 112. As shown in FIG. 7, the middle row of solder balls (124a, 124s and 124e) are directly connected to respective conductive vias (134a, 134s and 134e) as shown in FIG. 6.

The impedance $Z_2$ through the plane of the substrate base 112 is a function of the thickness of the dielectric material of the substrate base 112, the width of the signal via 134s, the distance between the signal via 134s and neighboring ground vias 134a and 134e, and the dielectric constant of the dielectric material of the substrate base 112.

Figure 2A:
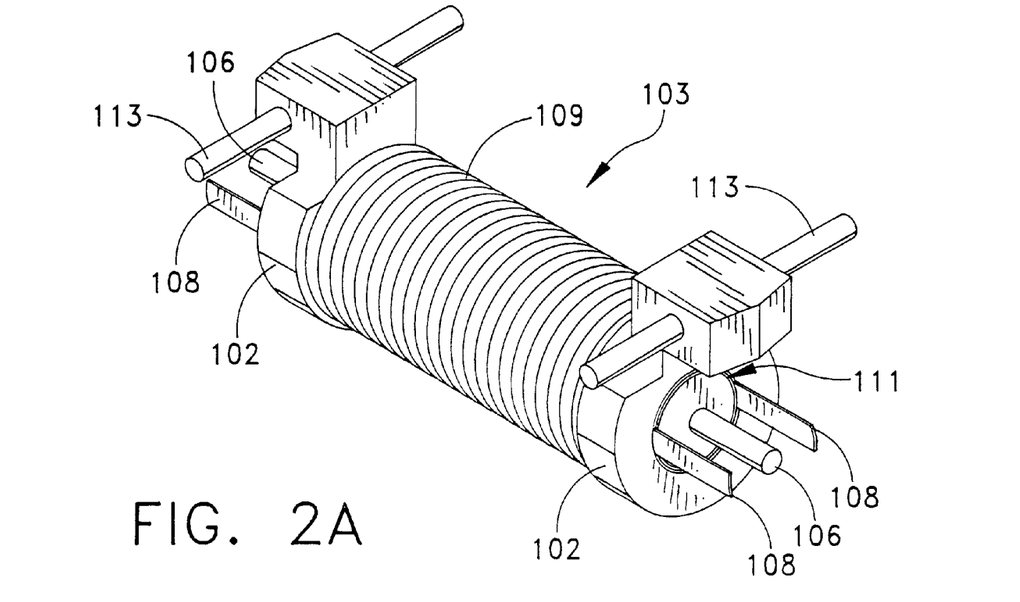
FIG. 2A is an perspective view a reed switch device in accordance with the preferred embodiment of the present invention.
Figure 2B:
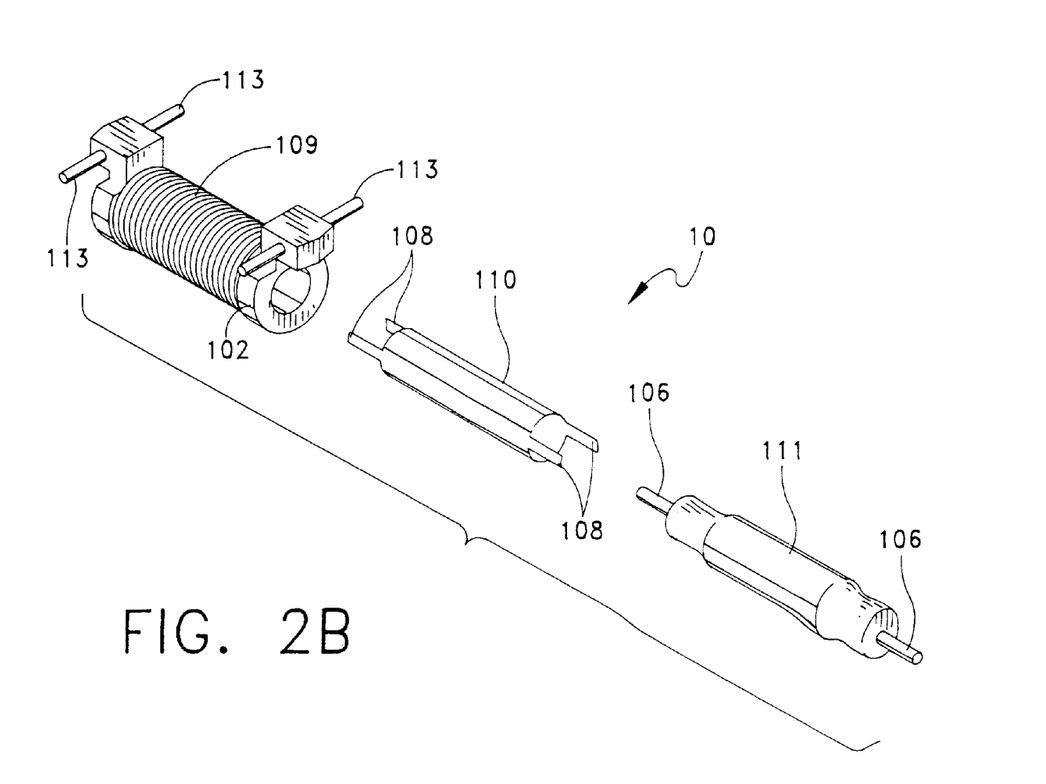
FIG. 2B is an exploded perspective view a reed switch device in accordance with the preferred embodiment of the present invention shown in FIG. 2A.

At the bottom surface 132 of the substrate base 112, a true co-axial arrangement is formed by providing additional solder balls 124b, 124c, 124d, 124f, 124g and 124h about the solder balls that directly receive a conductive via. These solder balls are electrically connected by an electrically conductive trace 136 so as to form a complete conductive loop about the signal lead via 134s corresponding to the central solder ball contact 124s. This loop of grounding forms an actual coaxial shield conductor in similar fashion to that found in the cylindrical shield conductor 130 about the reed switch 111 itself as shown in FIG. 2B. The shielding is not expressly for EMI shielding and the protection of neighboring components, but to contain and improve the fidelity of the signal of the reed switch 111. At the co-axial ground loop, the impedance $Z_3$ is a function of the diameter of the signal via 134s, the diameter of the ground loop and the dielectric constant of the insulative substrate base 112.

FIGS. 6–8 illustrate the employment of a wave guide to simulate a true coaxial environment. This unique wave guide extends through the actual plane of the substrate base 112 to the solder ball interconnections 124 at the bottom of the package 100. Unlike the prior art, the wave guide or simulated co-axial arrangement is continuous from the reed switch 111 itself to the solder ball interconnections 124 where a microstrip or wave guide is typically present on the circuit board (not shown). As a result, the signal is protected from uncontrolled discontinuities. The shielding protection for the signal lead 106 is extended and controlled from the actual body of the reed switch 111 to the actual electrical interface to the circuit board. In accordance with the present invention, impedances $Z_1$, $Z_2$, and $Z_3$ are substantially equal to one another so that the overall impedance of the signal transmission path is consistent and matched to the desired overall impedance value thus obviating the need for substantial circuit tuning by the user.

Turning now to FIGS. 9–14, an alternative embodiment 200 of the present invention is shown. As shown in the preferred embodiment, three conductive vias (134a, 134s and 134e) run through the plane of the substrate base 112 to maintain a wave guide or simulated co-axial environment through the plane of the substrate base 112 to avoid a discontinuity in the protection of the signal lead 106 and prevent signal degradation. The alternative embodiment 200 of FIGS. 9–14 provides additional through plane conductive vias 234 to more closely simulate a co-axial environment through the plane of the substrate base 212.

Figure 9:
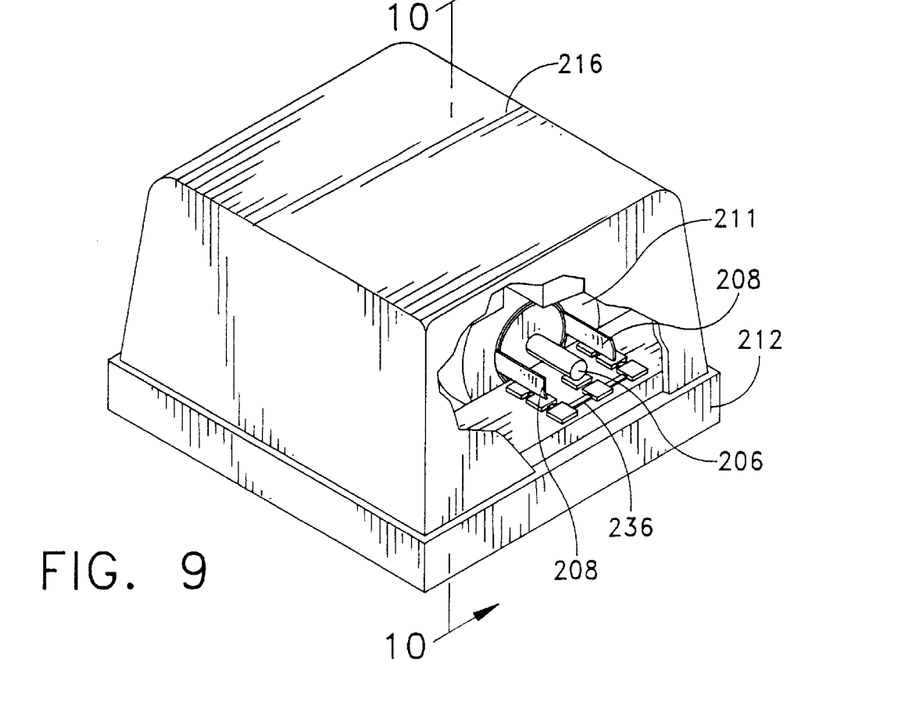
FIG. 9 is a perspective view of an alternative embodiment of the reed switch package of the present invention with a portion broken away for illustration purposes.
Figure 10:
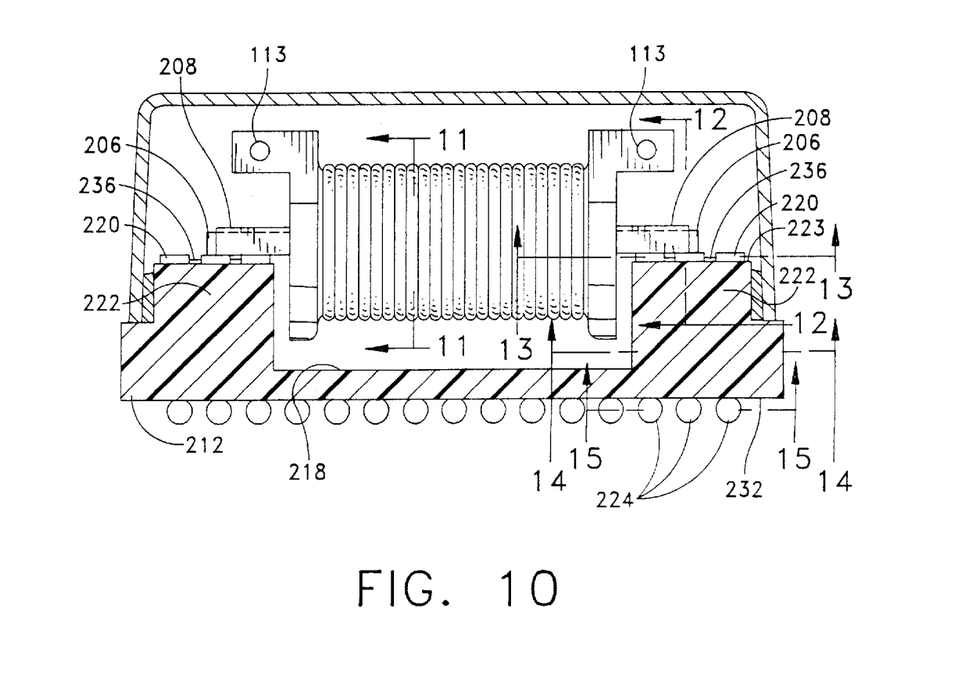
FIG. 10 is a cross-sectional view through the line 10—10 of FIG. 9.
Figure 11:
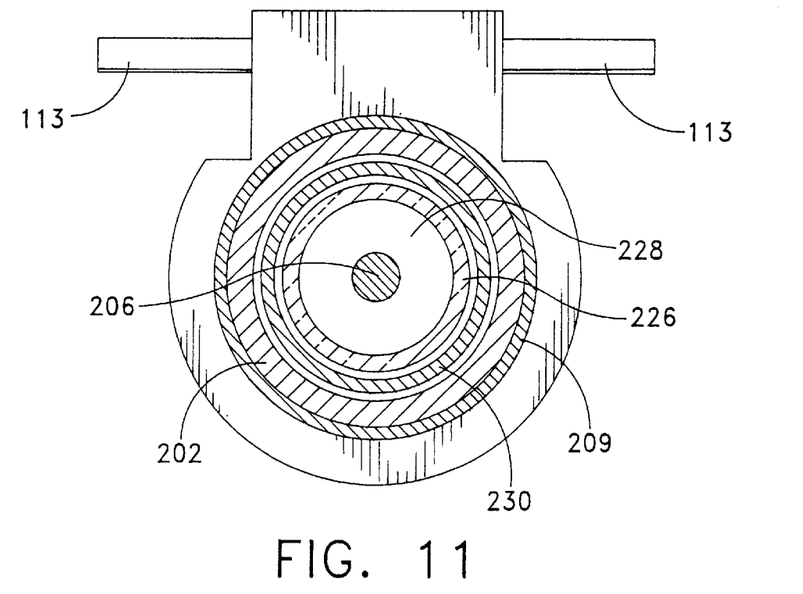
FIG. 11 is a cross-sectional view through the line 11—11 of FIG. 10.

Referring first to FIGS. 9–11, the alternative embodiment 200 employs the same basic components as the preferred embodiment of the present invention. FIG. 9 shows the entire reed switch package 200 with a substrate base 212 and protective shell 216. Emanating from the reed switch 211 is a signal lead 206 and two ground leads 208 on opposing sides thereof. The cross-section of the reed switch 211, as seen in FIG. 11, is identical to the reed switch 111 of the preferred embodiment 100. A recessed portion 218 is provided to receive the body of the reed switch 211 while a seat 222 receives and supports the signal lead 206 and two ground leads 208. Similar to the preferred embodiment 100 of the present invention, contact pads 220 are provided on the top surface 223 of the substrate base 212 to receive the signal lead 206 and two ground leads 208 on each side. These contact pads 220 are positioned in the middle of the seat 222 of the substrate base 212. Unlike the preferred embodiment 100 of the present invention, additional contacts pads 220a–h and 220s are provided on the top surface 223 of the substrate base 212 an interconnected with an electrically conductive circuit trace 236 to form an actual co-axial arrangement.

Figure 12:
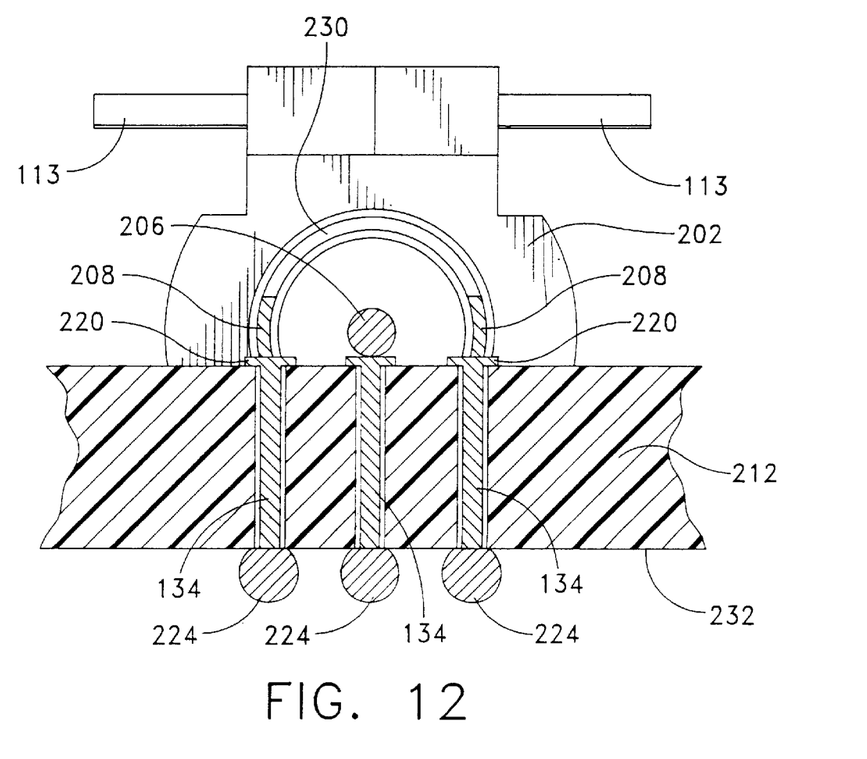
FIG. 12 is a cross-sectional view through the line 12—12 of FIG. 10.
Figure 13:
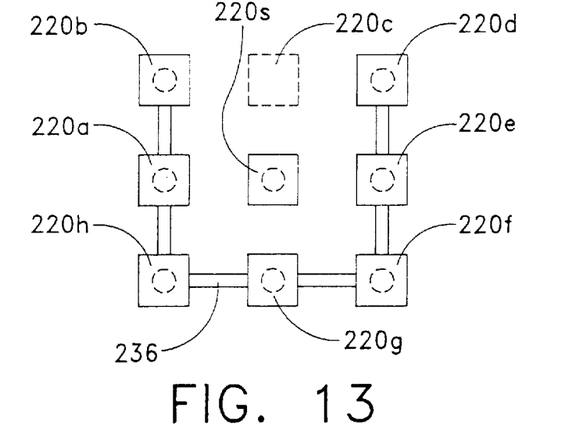
FIG. 13 is a cross-sectional view through the line 13—13 of FIG. 10.
Figure 14:
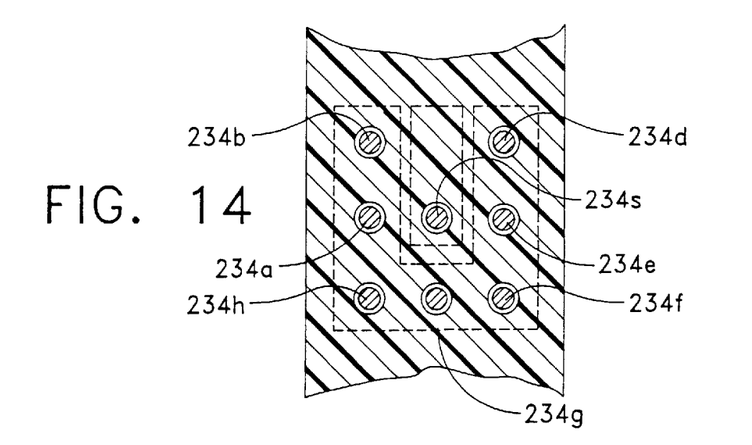
FIG. 14 is a cross-sectional view through the line 14—14 of FIG. 10.

As seen in FIG. 12, the signal lead 206 is extended through the plane of the substrate base 212 as are the ground leads 208 on opposing sides thereof. In addition, as shown in FIG. 14, a cross-section through the line 14—14 of FIG. 10, each of the additional contact pads 220 on the top surface 223 of the substrate base 212 are also extended through the plane of the substrate base 212 to solder balls 224 to provide an encircling wave guide about the conductive via 234s corresponding to the signal lead conductor 206 of the reed switch 211. In this alternative embodiment, the cylindrical shield conductor about the reed switch 211 is more closely simulated through the plane of the substrate base 212.

It should be noted that FIG. 14 illustrates a U-shaped encirclement of the signal lead conductor via 234s in the center. The missing conductive via 234c (shown in dotted line shadow) directly below the signal conductive via 234s is due to the missing pad on the top surface 223 of the substrate base 212, as shown in FIG. 9. The signal lead 206 exits the reed switch body 211 and must interconnect with the contact pad 220s at the center of the contact pad array. In this arrangement where the signal lead 206 and ground leads 208 contact the contact pads 220 parallel to the top surface 223 of the substrate base 212, it is not possible to connect to a middle contact pad 220s without contacting 220c. It is acceptable for the ground leads 208 to contact multiple pads 220 since they will be ultimately interconnected via a conductive trace 236. However, the signal lead 206 must not touch a contact pad 220 corresponding to a ground lead 208 as it will short out the signal rendering it unusable. Therefore, no contact pad 220c is provided between the signal contact pad and the reed switch 211 itself. Of course, it is possible to, indeed, provide a ground contact 208 pad between the signal contact pad and the reed switch 211 to provide a complete ground loop, however, the signal lead 206 must raised and then bent downwardly so as to only contact the center contact pad corresponding to the signal lead 206. In this condition, an additional through-via will be employed. Further, in this alternative embodiment, an interconnecting trace may be provided on the bottom surface 232 of the substrate base 212 to provide additional actual co-axial structure.

Figure 15:
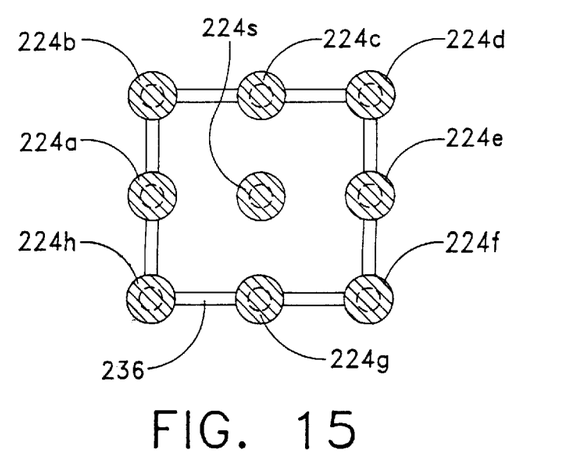
FIG. 15 is a cross-sectional view through the line 15—15 of FIG. 10.

As shown in FIG. 15, a cross-sectional view through the line 15—15 of FIG. 10, a true co-axial arrangement is formed and resumed at the bottom surface 232 of the substrate base 212, by providing additional solder balls 224b, 224c, 224d, 224f, 224g and 224h about the solder balls that directly receive a conductive via. These solder balls are electrically connected by an electrically conductive trace 236 so as to form an complete conductive loop about the signal lead via 234s corresponding to the central solder ball contact 224s. This loop of grounding forms an actual co-axial shield conductor in similar fashion to that found in the cylindrical shield conductor 230 about the reed switch 111. In this second embodiment, an actual co-axial loop is preferably provided both at the top surface 223 and bottom surface 232 of substrate base 212.

As can be understood, present invention provides either an actual or simulated co-axial environment for superior protection of the signal lead of a reed switch. This continuous co-axial protection is not found in prior art packages. The through-plane conductive vias enable a continuous co-axial environment to be provided from the reed switch directly down to the electrical interconnection to the circuit board. In most applications, due to the frequency of the transmitted signal by the reed switch, a complete continuous ground loop is not needed to provide a co-axial arrangement for signal lead protection. In the present invention, the ground conductor vias are preferably on a 1.27 mm or 1.00 mm grid. Common frequencies for the reed switch are in the 1.0 to 8.0 GHz range. At these frequencies, the wavelengths are in the 300 mm to 40 mm range. The wavelengths are too long to sense any discontinuities of the "simulated" co-axial arrangement. Therefore, the simulated co-axial arrangement is essentially identical in effectiveness compared to a true full co-axial arrangement. As a result, this topology provides for effective shielding until the wavelength gets so small that the conductor via grid will be seen as discontinuous. For the grids discussed above, effective shielding can be realized with the present invention with wavelengths as low as 8 mm with a frequency of 37 GHz. Greater or fewer conductive vias through the plane of the substrate base may be employed depending on the device within the package and the application at hand.

The package of the present may be easily modified to accommodate more than one reed switch at a time to provide multiple channels. In this arrangement, the appropriate solder ball interconnections are employed for each reed switch corresponding to a given channel. Further, may different types of interconnections may be employed by the package of the present invention. It should be understood that the package of the present invention can accommodate a wide array of electronic devices that require signal lead shielding with a controlled impedance environment.

While the package of the present is shown to employ solder balls in a BGA package for electric interconnection to a circuit board, other types of interconnections may be employed such as pin grids, land grids. Further, ball grid array socket arrangement may be used to facilitate removal or replacement of the package when desired. The substrate base body is preferably a dielectric material such as plastic but may be manufactured of any other material suitable for electronic device packages. The vias employed in the present invention may be made of known conductive materials, such as copper, aluminum, tin and other know alloys in the industry.

It would be appreciated by those skilled in the art that various changes and modifications can be made to the illustrated embodiments without departing from the spirit of the present invention. All such modifications and changes are intended to be covered by the appended claims.

What is claimed is:

1. A reed device package, comprising:
   a reed switch having electrical signal terminals;
   a ground shield surrounding said reed switch;
   a first ground terminal connected to said ground shield;
   a second ground terminal connected to said ground shield;
   at least one of said electrical signal terminals being positioned between said first ground terminal and said second ground terminal;
   a support substrate having a main body with a top surface and a bottom surface; said reed switch device being disposed on said support substrate;
   a electrically conductive signal via extending through said main body between said top surface and said bottom surface; said signal via being electrically connected to said electrical signal terminals of said reed switch;
   an electrically conductive first ground via extending through said main body between said top surface and said bottom surface; said first ground via being electrically connected to said first ground terminal; said first ground via being positioned substantially parallel to and in spaced apart relation to said signal via;

an electrically conductive second ground via extending through said main body between said top surface and said bottom surface; said second ground via being electrically connected to said second ground terminal; said second ground via being positioned substantially parallel to and in spaced apart relation to said signal via and on an opposing side of said signal via as said first ground via;

means for interconnecting said signal via, at said bottom surface of said main body, to a signal line of a circuit;

means for interconnecting said first ground via, at said bottom surface of said main body, to a first ground line of a circuit; and means for interconnecting said second ground via, at said bottom surface of said main body, to a second ground line of a circuit.

2. The reed device package of claim 1, further comprising a loop of electrically conductive material on said bottom surface of said main body; said loop of electrically conductive material interconnecting said first ground via and said second ground via and being substantially co-axially positioned about said signal via.

3. The reed device package of claim 1, wherein said main body is dielectric material.

4. The reed device package of claim 1, wherein said means for interconnecting said signal via, said means for interconnecting said first ground via and said means for interconnecting said second ground via are solder balls.

5. A reed device package, comprising:
a reed switch having electrical signal terminals;
a ground shield surrounding said reed switch;
a first ground terminal connected to said ground shield;
a second ground terminal connected to said ground shield;
at least one of said electrical signal terminals being positioned between said first ground terminal and said second ground terminal;
a support substrate having a main body with a top surface and a bottom surface; said reed switch device being disposed on said support substrate;
a loop of electrically conductive material on said top surface of said main body; said loop of electrically conductive material interconnecting said first ground via and said second ground via and being substantially co-axially positioned about said signal via;
a electrically conductive signal via extending through said main body between said top surface and said bottom surface; said signal via being electrically connected to one of said electrical signal terminals of said reed switch;
a plurality of electrically conductive ground vias extending through said main body between said top surface and said bottom surface; said plurality of ground vias being electrically connected to said loop of electrically conductive material on said top surface; said plurality of ground vias being positioned substantially parallel to and surrounding said signal via;
means for interconnecting said signal via, at said bottom surface of said main body, to a signal line of a circuit; and
means for interconnecting said plurality of ground vias, at said bottom surface of said main body, to a ground line of a circuit.

6. The reed device package of claim 5, wherein said ground shield is substantially cylindrical in shape.

7. The reed device package of claim 5, wherein said support substrate is made of dielectric material.

8. The reed device package of claim 5, wherein said means for interconnecting said signal via is a solder ball.

9. The reed device package of claim 5, wherein said means for interconnecting said plurality of ground vias are solder balls.

10. A reed device package, comprising:
a reed switch having a first end and a second end;
a first electrical signal terminal connected to said first end of said reed switch;
a second electrical signal terminal connected to said second end of said reed switch;
a substantially cylindrical ground shield, having a longitudinal axis, housing said reed switch; said cylindrical ground shield including a first open end edge and a second open end edge;
a first ground terminal connected to a region of said first open end edge;
a second ground terminal connected to a region of said first open edge across from said first ground terminal;
a third ground terminal connected to a region of said second open edge;
a fourth ground terminal connected to a region of said second open edge across from said third ground terminal;
a support substrate having a main body with a top surface and a bottom surface; said reed switch device being disposed on said support substrate;
a first electrically conductive signal via extending through said main body between said top surface and said bottom surface; said first signal via being electrically connected to said first electrical signal terminal of said reed switch;
a second electrically conductive signal via extending through said main body between said top surface and said bottom surface; said second signal via being electrically connected to said second electrical signal terminal of said reed switch;
an electrically conductive first ground via extending through said main body between said top surface and said bottom surface; said first ground via being electrically connected to said first ground terminal; said first ground via being positioned substantially parallel to and in spaced apart relation to said first signal via;
an electrically conductive second ground via extending through said main body between said top surface and said bottom surface; said second ground via being electrically connected to said second ground terminal; said second ground via being positioned substantially parallel to and in spaced apart relation to said first signal via and on an opposing side of said first signal via as said first ground via;
an electrically conductive third ground via extending through said main body between said top surface and said bottom surface; said third ground via being electrically connected to said third ground terminal; said third ground via being positioned substantially parallel to and in spaced apart relation to said second signal via;
an electrically conductive fourth ground via extending through said main body between said top surface and said bottom surface; said fourth ground via being electrically connected to said fourth ground terminal; said fourth ground via being positioned substantially parallel to and in spaced apart relation to said second signal via and on an opposing side of said second signal via as said third ground via;

means for interconnecting said first signal via, at said bottom surface of said main body, to a first signal line of a circuit;

means for interconnecting said second signal via, at said bottom surface of said main body, to a second signal line of a circuit;

means for interconnecting said first ground via, at said bottom surface of said main body, to a first ground line of a circuit;

means for interconnecting said second ground via, at said bottom surface of said main body, to a second ground line of a circuit;

means for interconnecting said third ground via, at said bottom surface of said main body, to a third ground line of a circuit; and means for interconnecting said fourth ground via, at said bottom surface of said main body, to a fourth ground line of a circuit.

11. The reed device package of claim 10, further comprising:

a first loop of electrically conductive material on said bottom surface of said main body; said first loop of electrically conductive material interconnecting said first ground via and said second ground via and being substantially co-axially positioned about said first signal via; and a second loop of electrically conductive material on said bottom surface of said main body; said second loop of electrically conductive material interconnecting said third ground via and said fourth ground via and being substantially co-axially positioned about said second signal via.

12. The reed device package of claim 10, wherein said main body is dielectric material.

13. The reed device package of claim 10, wherein said means for interconnecting said first signal via, said second signal via, said means for interconnecting said first ground via, said means for interconnecting said second ground via, said means for interconnecting said third ground via and said means for interconnecting said fourth ground via are solder balls.

* * * * *